(12) United States Patent
Wang et al.

(10) Patent No.: US 7,737,556 B2
(45) Date of Patent: Jun. 15, 2010

(54) ENCAPSULATED DAMASCENE WITH IMPROVED OVERLAYER ADHESION

(75) Inventors: Chao-Hsiung Wang, Hsin-Chu (TW); Ping-Kun Wu, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 586 days.

(21) Appl. No.: 11/241,355

(22) Filed: Sep. 30, 2005

(65) Prior Publication Data

US 2007/0075428 A1    Apr. 5, 2007

(51) Int. Cl.
  *H01L 23/48*    (2006.01)
(52) U.S. Cl. ................ 257/753; 257/751; 257/758; 257/E21.575
(58) Field of Classification Search .......... 257/751, 257/753, 758–760, 763–764, 774–775, E21.584, 257/E21.585, E21.575
See application file for complete search history.

(56) References Cited

U.S. PATENT DOCUMENTS 6,653,224 B1    11/2007    Gotkis et al.

| | | | |
|---|---|---|---|
| 2003/0057457 A1* | 3/2003 | Yamada et al. | 257/249 |
| 2004/0124531 A1* | 7/2004 | Venkatraman et al. | 257/751 |
| 2005/0014360 A1* | 1/2005 | Yu et al. | 438/622 |
| 2005/0087871 A1* | 4/2005 | Abe | 257/751 |

* cited by examiner

*Primary Examiner*—Thanhha Pham
(74) *Attorney, Agent, or Firm*—Tung & Associates

(57) ABSTRACT

An integrated circuit device comprising a partially embedded and encapsulated damascene structure and method for forming the same to improve adhesion to an overlying dielectric layer, the integrated circuit device including a conductive material partially embedded in an opening formed in a dielectric layer; wherein said conductive material is encapsulated with a first barrier layer comprising sidewall and bottom portions and a second barrier layer covering a top portion, said conductive material and first barrier layer sidewall portions extending to a predetermined height above an upper surface of the dielectric layer to form a partially embedded damascene.

20 Claims, 3 Drawing Sheets

ENCAPSULATED DAMASCENE WITH IMPROVED OVERLAYER ADHESION

FIELD OF THE INVENTION

This invention generally relates to integrated circuit device manufacturing and more particularly to embedded conductive features (damascenes) having improved adhesion properties with respect to overlying layers including low-K dielectric layers.

BACKGROUND OF THE INVENTION

In typical multi-layer semiconductor device, electrical interconnects including vias, interconnect lines, and bonding pads are formed in dielectric layers by embedding a conductive material in openings formed in the dielectric layer.

A process wafer typically includes a semiconductor substrate including active semiconductor devices formed thereover, followed by the formation of multiple layers of conductive wiring including vias and trench lines, and including uppermost layers having bonding pads for subsequent electrical interconnection by various methods to external circuits.

Following device formation in individual die areas on a wafer, the process wafer is subjected to various operations including wafer acceptance testing (WAT), dicing operations to form individual die, die interconnection bonding processes into packaged chips and the like, where the multi-layer device is subjected to both thermal and mechanical stresses including shear force components directed parallel to a layer thickness. The shear forces applied to the semiconductor device by the various processing operations can lead to catastrophic peeling of one or more layers of the multi-layer semiconductor device.

The problem is exacerbated where low-K (low dielectric constant) dielectric layers are used, as the low-K materials are typically less mechanically robust and have poor adhesion to overlying material layers. For example, the shear modulus (resistance to shear force) of the multi-layer device is crucial during die formation and assembly into packaged chips. While prior art approaches have been proposed to solve this problem, the approaches to date have been less than adequate in forming a multi-layer semiconductor device with adequate resistance to shear forces, leading to less than adequate device yield and reliability.

There is therefore a need in the semiconductor device integrated circuit manufacturing art to develop a multi-layer semiconductor device including embedded conductive features with improved structural stability and resistance to shear forces.

It is therefore an object of the invention to provide a multi-layer semiconductor device including embedded conductive features with improved structural stability and resistance to shear forces, while overcoming other deficiencies and shortcomings of the prior art.

SUMMARY OF THE INVENTION

To achieve the foregoing and other objects, and in accordance with the purposes of the present invention, as embodied and broadly described herein, the present invention provides an integrated circuit device comprising a partially embedded and encapsulated damascene structure and method for forming the same to improve adhesion to an overlying dielectric layer.

In a first embodiment, the integrated circuit device includes a conductive material partially embedded in an opening formed in a dielectric layer; wherein said conductive material is encapsulated with a first barrier layer comprising sidewall and bottom portions and a second barrier layer covering a top portion, said conductive material and first barrier layer sidewall portions extending to a predetermined height above an upper surface of the dielectric layer to form a partially embedded damascene.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to formation of an exemplary embedded conductive damascene structure it will be appreciated that the method of the present invention is applicable to the formation of single damascene structures including vias, interconnect lines, dual damascenes, and bonding pads as well as stacked damascene structures. The partially embedded conductive damascene is formed whereby the upper portion is selectively raised above a surrounding dielectric layer surface e.g., to protrude a predetermined height above the dielectric layer surface, and a conductive portion is then selectively capped with a barrier layer to thereby encapsulate the conductive filling portion off the damascene to thereby improve an adhesion to a subsequently formed overlying dielectric layer including a low-K dielectric layer.

Figure 1A:
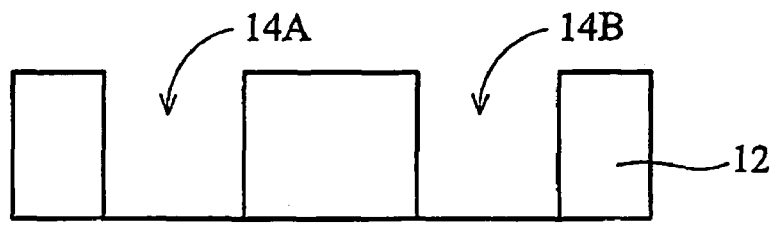
FIGS. 1A-1H are representative cross sectional views of portions of multi-layer semiconductor device integrated circuit at stages in a manufacturing process according to an embodiment of the present invention.

Referring to FIG. 1A, the method of the present invention will now be explained with respect to exemplary damascene structures. Shown in FIG. 1A a low-K dielectric layer 12, forming a portion of a multi-layer semiconductor device, is formed over an underlying layer (not shown) which may include one or more conductive regions such as vias and/or interconnect lines (not shown) to provide device wiring.

Openings, e.g., 14A and 14B are formed in the dielectric layer by conventional processes such as forming a patterned photoresist layer (not shown) over the dielectric layer 12, which may include an uppermost organic or inorganic BARC layer such as amorphous carbon, silicon oxynitride, silicon carbon (eg. SiC), silicon carbon nitride (eg. SiCN), or carbon doped silicon oxide (eg. SiOC). A plasma assisted etch process, such as reactive ion etch (RIE) is then carried out according to the patterned resist layer to form openings 14A and 14B.

The dielectric layer 12 is preferably a low-K material such as carbon and/or fluorine doped silicon oxide, organo-silicate glass (OSG), and fluorinated silicate glass (FSG) formed by known methods. Other suitable low-K materials for forming the dielectric layer 12 may include, for example, silsesquioxanes such as hydrogen silsesquioxane (HSQ) and methyl silsesquioxane (MSQ), poly(arylene)ethers, benzocyclobutene (BCB), nanoporous silicon oxide, and dielectric layers formed of organo-silane and/or organo siloxane precursors by known methods. By the term "low-K" is meant having a dielectric constant of less than about 3.5, more preferably less than about 3.0. It will be appreciated that the dielectric layer 12 may include one or more intervening etch stop layers (not shown) such as silicon nitride (e.g., $SiN_x$, $2 \geq x > 0$), silicon oxynitride (e.g., SiON), silicon carbon (eg. SiC), carbon doped silicon oxide (e.g., SiOC), silicon carbon nitride (e.g., SICN), or combinations thereof, e.g., separating a lower dielectric layer portion and an upper dielectric layer portion, e.g., for forming a dual damascene.

Figure 1B:
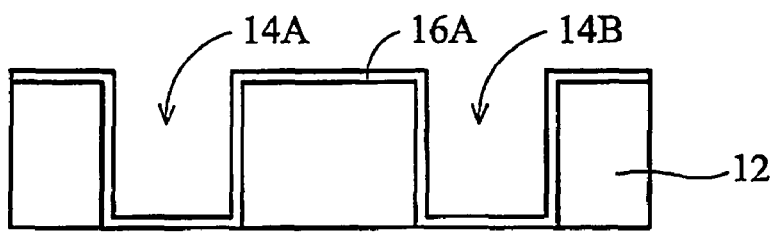

Referring to FIG. 1B, following formation of openings 14A and 14B, a barrier layer 16A is blanket deposited over the dielectric layer 12 to include lining the openings 14A and 14B. The barrier layer preferably includes a refractory metal and/or refractory metal nitride, for example Ta, TaN, Ti, TiN, cobalt tungsten (eg. $CoW_x$, $3 \geq x > 0$), B or P doped $CoW_x$, or combinations thereof.

Figure 1C:
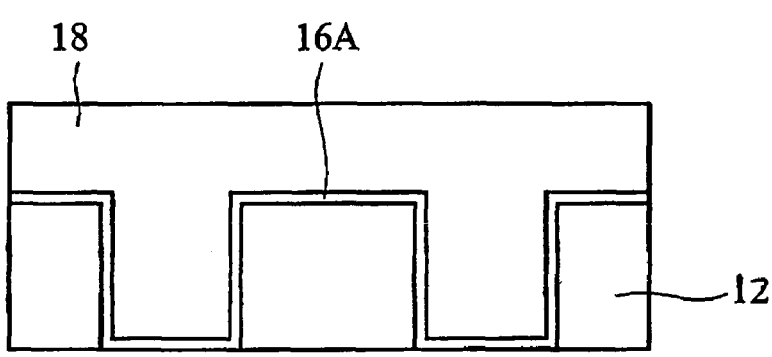

Referring to FIG. 1C, the openings are then backfilled with a blanket deposited conductive material layer 18, for example a metal such as aluminum, copper, silver, as well as alloys or combinations thereof. The metal may be deposited by conventional processes including CVD, PECVD, PVD, and electro-chemical deposition (ECD) methods.

Figure 1D:
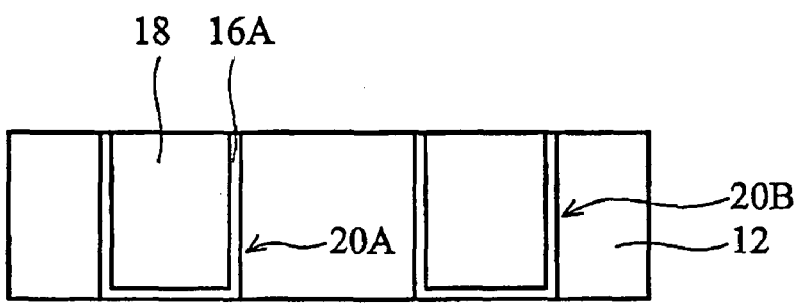

Referring to FIG. 1D, in an important aspect of the invention, the deposited conductive layer 18 and barrier layer 16A portion overlying the dielectric layer 12 are then removed, e.g., by a dry etchback process and/or a first CMP process, most preferably a first CMP process to stop on the dielectric layer 12 to form damascene structures e.g., 20A, 20B.

Figure 1E:
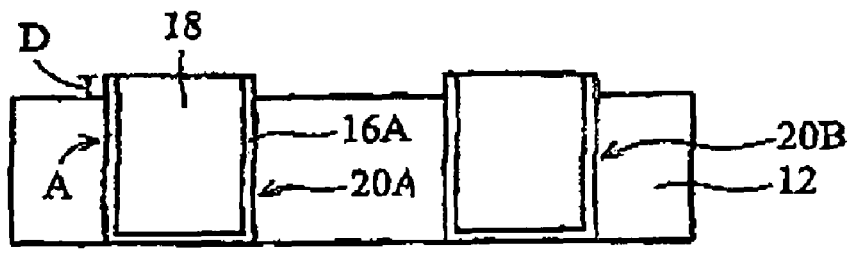

Referring to FIG. 1E, in an important aspect of the invention, a second CMP process (or other chemical removal processes such as dilute HF acid, or physical removal process such as resputter process in-situ in the barrier layer 16 deposition) is then carried out to selectively remove a thickness portion of the dielectric layer 12 upper surface to leave an upper portion of the damascene structures e.g., 20A, 20B, including barrier layer 16A sidewall portions, protruding (extending) above the surface of the dielectric layer 12. In another important aspect of the invention the damascene structures e.g., 20A, 20B are preferably formed to extend a distance (height) D above the dielectric layer 12 surface by no less than about $X(1-1/e)$ where X is the thickness of the barrier layer 16A sidewall portion e.g., A, and the constant e is base of the natural logarithm and is about 2.718. For example, the distance D is preferably not less than about 0.63 times the thickness of the barrier layer 16A sidewall portion.

For example, it has been found that the optimal distance. D for promoting adhesion of an overlying dielectric layer is strongly dependent on the sidewall thickness of the barrier layer 16A. When the barrier layer 16A is relatively thick e.g., greater than about 100 Angstroms the distance D may be greater than 63% of the barrier layer thickness since sufficient area of the protruding sidewall portion of barrier layer 16A remains following CMP of the dielectric layer to provide adequate adhesion 'gluing' at the edges to a subsequently deposited overlying dielectric layer shown below. On the other hand, when the barrier layer 16A thickness is less than about 100 Angstroms it has been found that the minimal height restraints imposed on D is required to provide sufficient adhesion to an overlying dielectric layer. In addition, the height D may be greater in a relatively low metallization pattern density area of the process wafer compared to a relatively high metallization pattern density. For example, a large height D, in a relatively low metallization pattern density area provides increased contact area for adhesion. On the other hand, in a relatively high metallization pattern density area, D may be lower, but not less than the minimal desired height restraints imposed above, to provide adequate adhesive contact area with an overlying dielectric layer. Preferably the barrier layer 16A is formed having a thickness of about 45 Angstroms to about 350 Angstroms.

Figure 1F:
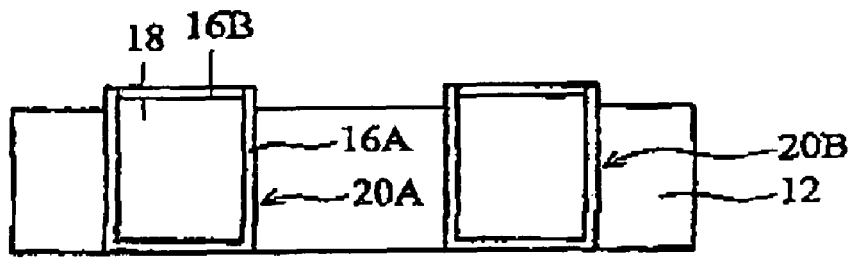

Referring to FIG. 1F, in another important aspect of the invention, a capping barrier layer e.g., 16B is selectively formed over the upper exposed portion of the conductive material layer portions 18 of damascene structures e.g., 20A, 20B. For example, a conductive alloy is formed with the upper exposed portion of the conductive material layer 18 to form the capping barrier layer 16B. For example, the conductive alloy may be selectively formed by exposing the process surface to selectively reacting gas species, for example, using reactive gas flow (e.g., APCVD, LPCVD, ALCVD), ion bombardment, or plasma treatment with a reactive gas, to selectively form a conductive alloy of reacting gas species and the conductive material layer 18. The reactive gas species may be any reactive gas species that forms an alloy with the conductive material. In one embodiment, Si, Ge, and SiGe alloys are suitably formed with the conductive material. For example, reactive gases including Si and Ge, such as $SiH_4$, and $GeH_4$, may be advantageously used to selectively form the capping barrier layer e.g., 16B. In one embodiment of the invention, the capping barrier layer 16B is cobalt tungsten (eg. $CoW_x$, $3 \geq x > 0$), B or P doped $CoW_x$ by an electroless plating deposition or other chemical vapor deposition such as ALD. Capping barrier layer e.g., 16B is preferably formed having a thickness of not less than about 25 Angstroms, for example from about 25 Angstroms to about 200 Angstroms.

In another aspect of the invention, the capping barrier layer 16B is preferably formed to have an average or mean conductive alloy grain size no smaller than that of the barrier layer 16A, preferably having a greater average or mean grain size than the barrier layer 16A to promote adhesion to an overlying dielectric layer. It will be appreciated that grain size will depend on the conductive alloy formed, and may be influenced by formation conditions including temperature as well as subsequent annealing processes.

It will be appreciated that the capping barrier layer 16B may be first deposited to selectively form a conductive alloy with conductive material layer 18 at an upper portion of the damascene structures 20A, 20B, followed by a selective wet or dry etching process to remove residual materials formed by the reactive gas overlying the dielectric layer 12 surface, optionally including a photolithographic patterning to cover capping barrier layer 16B and barrier layer 16A sidewall portions with a protective photoresist.

Figure 1G:
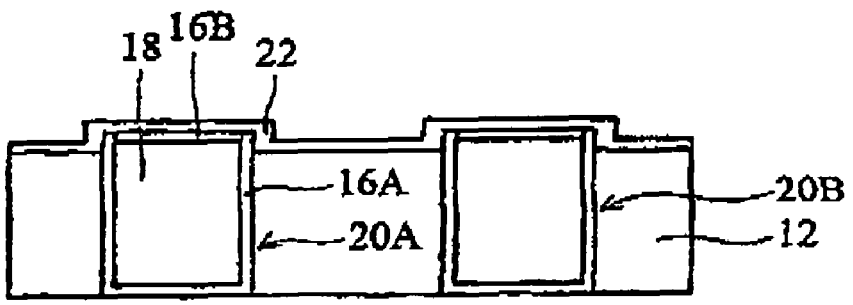

Referring to FIG. 1G, following formation of the conductive alloy (capping) barrier layer 16B to encapsulate the damascene structures e.g., 20A, 20B e.g., surround conductive material in three-dimensions, a capping dielectric layer 22 may be optionally formed (e.g., blanket deposited) over the damascene structures e.g., 20A, 20B and the dielectric layer 12. The capping dielectric layer 22 preferably includes carbon and/or nitrogen to promote adhesion to an overlying dielectric layer, for example, formed silicon nitride, (eg. $SiN_x$, $2 \geq x > 0$), silicon oxynitride (eg. SiON), silicon carbon (eg. SiC), carbon doped silicon oxide (eg. SiOC), silicon carbon nitride (eg. SiCN), amorphous carbon, carbon doped silicon oxide, and combinations thereof. The capping dielectric layer 22 is preferably formed at a thickness less than about 450 Angstroms and preferably has a dielectric constant of less than about 5.

Figure 1H:
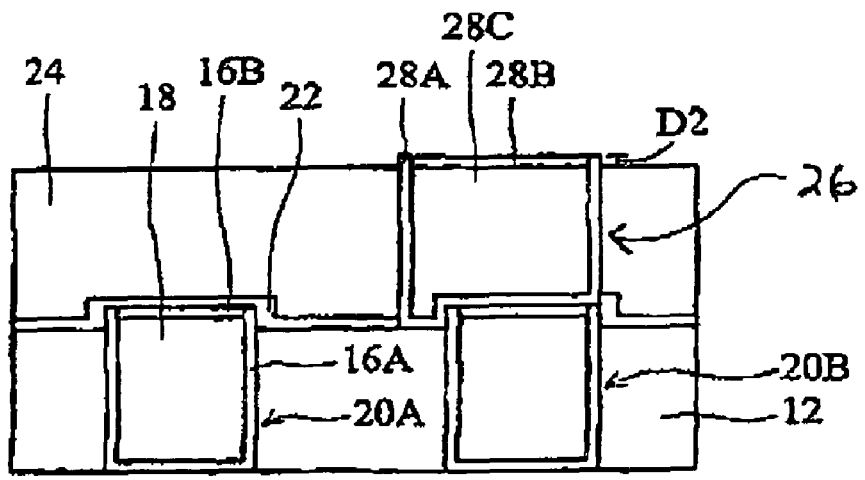

Referring to FIG. 1H, a second dielectric layer 24, according to the same preferred embodiments as outlined above for dielectric layer 12 is then formed over dielectric layer 12 and damascene structures e.g., 26 optionally formed at least partially overlying, preferably having a larger width, with respect to one or more of the underlying damascene structures e.g., 20B. The overlying damascene 26 is formed in electrical communication with an underlying damascene structure e.g., 20B, to form for example, a dual damascene structure by repeating similar processes previously outlined for forming damascene structures e.g., 20A, 20B. The overlying damascene portion 26 is shown formed including the process steps of forming protruding height, e.g., D2 of the damascene structure 26 and including barrier layers 28A and capping barrier layer 28B, and backfilled with conductive material 28C. It will be appreciated that subsequent process steps including forming a capping dielectric layer and an overlying dielectric layer may be repeated as previously outlined.

Figure 2:
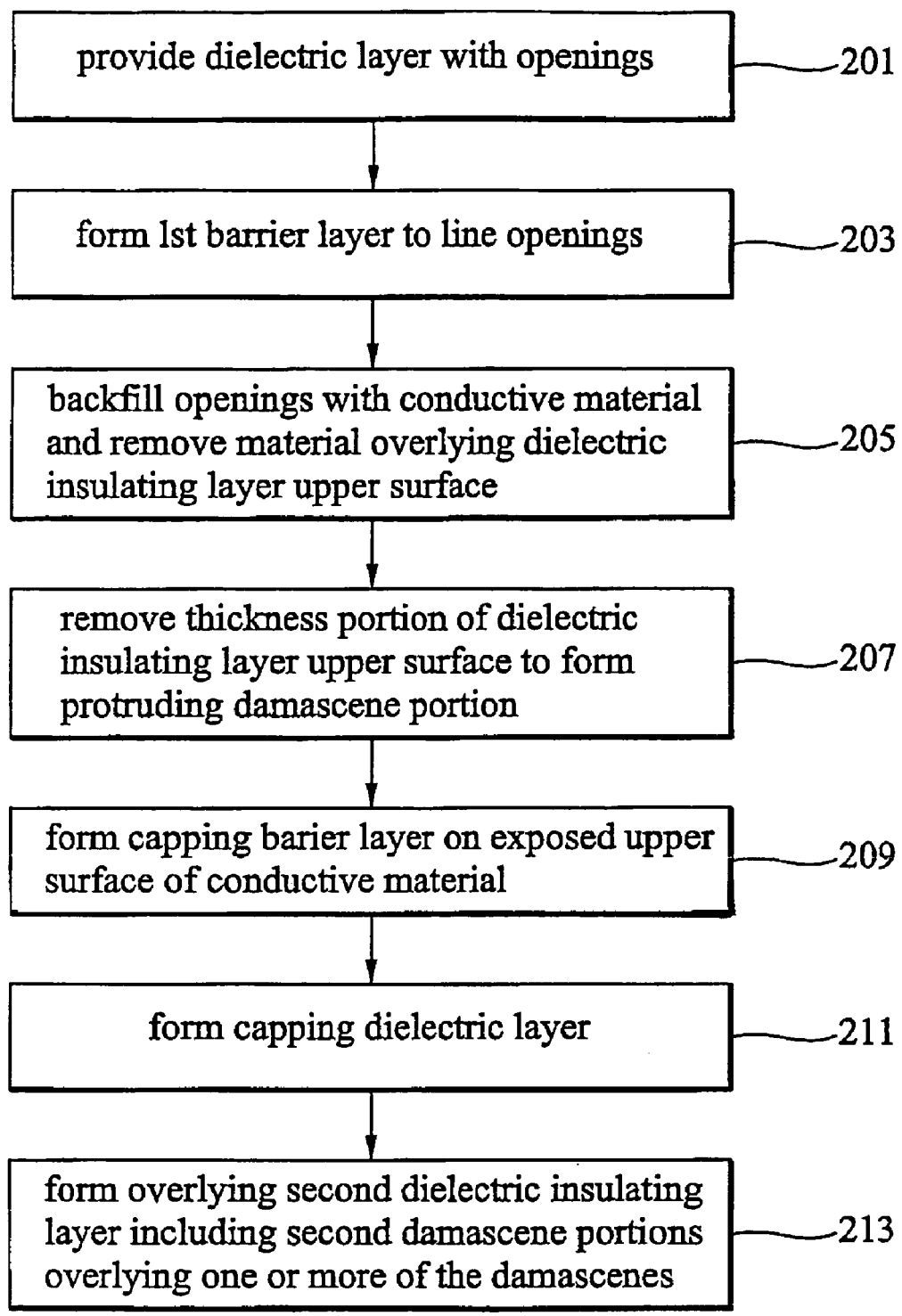
FIG. 2 is a process flow diagram including several embodiments of the present invention.

Referring to FIG. 2 is shown a process flow diagram including several embodiments of the present invention. In process 201, a dielectric layer is provided including etched openings for forming damascenes. In process 203, a first barrier layer is blanket deposited to line the etched openings. In process 205, the openings are backfilled with conductive material and where the conductive material and first barrier layer overlying the dielectric layer upper surface are removed. In process 207, a thickness portion of the dielectric layer upper surface is removed to leave protruding damascene portions e.g., including first barrier layer sidewalls and conductive material portions protruding above the dielectric layer surface. In process 209, a capping barrier layer forming an alloy with the conductive material portion of the damascenes is formed on the exposed upper portion of the conductive material. In process 211, an optional capping dielectric layer is formed over the damascenes and dielectric layer. In process 213, a second dielectric layer is formed on the capping dielectric layer and second damascenes formed overlying one or more of the damascenes by similar process steps e.g., beginning at process 201.

Thus, according to the present invention, embedded damascenes and method of forming the same has been presented whereby improved structural stability including improved adhesion to overlying dielectric layers has been provided. The improved structural stability includes improved resistance to mechanical and/or thermal shearing forces present in subsequent processing/packaging steps thereby improving device yield and reliability.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. An integrated circuit device with improved adhesion to an overlying dielectric layer comprising:
   a conductive material partially embedded in an opening formed in a dielectric layer;
   a first barrier layer partially embedded in said opening formed in said dielectric layer, wherein said first barrier layer comprises first portions covering sidewall portions of said conductive material; and
   a second barrier layer upon only a top portion of said conductive material, said second barrier layer comprising a conductive alloy having an average grain size substantially the same or greater than an average grain size of said first portion of said first barrier layer, said first and second barrier layers encapsulating said conductive material;
   wherein said conductive material and said first portions of said first barrier layer extend to a predetermined height above an upper surface of said dielectric layer to form a first partially embedded damascene, said predetermined height not less than about 0.63 times the thickness of said first portion of said first barrier layer; and,
   a second partially embedded damascene having a larger width than said first partially embedded damascene at least partially upon said first partially embedded damascene to form a dual damascene.

2. The integrated circuit device of claim 1, wherein the predetermined height is greater than about $X(1-1/e)$ wherein X is a thickness of said first portion of said first barrier layer, and the constant e is base of the natural logarithm.

3. The integrated circuit device of claim 1, wherein said first barrier layer comprises a material selected from the group consisting of a refractory metal and a refractory metal nitride.

4. The integrated circuit device of claim 1, wherein said first barrier layer comprises cobalt, tungsten or combinations thereof.

5. The integrated circuit device of claim 1, wherein said second barrier layer comprises a conductive alloy comprising a material selected from the group consisting of Si, Ge, and combinations thereof, said conductive alloy further comprising said conductive material.

6. The integrated circuit device of claim 1, wherein said second barrier layer comprises a conductive alloy comprising a material selected from the group consisting of cobalt, tungsten, and combinations thereof.

7. The integrated circuit device of claim 1, wherein said second barrier layer comprises a conductive alloy comprising said conductive material.

8. The integrated circuit device of claim 1, further comprising a dielectric capping layer overlying said first partially embedded damascene, wherein said dielectric capping layer comprises a component selected from the group consisting of carbon and nitrogen.

9. The integrated circuit device of claim 8, wherein said dielectric capping layer has a dielectric constant of less than about 5.

10. The integrated circuit device of claim 1, wherein said dielectric layer has a dielectric constant of less than about 3.5.

11. The integrated circuit device of claim 1, wherein the dielectric layer comprises a material of carbon doped silicon oxide.

12. An integrated circuit device with improved adhesion to an overlying dielectric layer and improved resistance to shear comprising:
   a conductive material partially embedded in an opening formed in a first dielectric layer, said first dielectric layer having a dielectric constant less than about 3.5;
   a first barrier layer partially embedded in said opening formed in said dielectric layer, wherein said first barrier layer comprises first portions covering sidewall portions of said conductive material;
   a second barrier layer upon only a top portion of said conductive material, said second barrier layer comprising a conductive alloy having an average grain size substantially the same or greater than an average grain size of said first portion of said first barrier layer, said first and second barrier layers encapsulating said conductive material;
   wherein said conductive material and said first portions of said first barrier layer extend to a predetermined height above an upper surface of said dielectric layer to form a first partially embedded damascene, said predetermined height not less than about 0.63 time the thickness of said first portion of said first barrier layer;
   a dielectric capping layer overlying said first partially embedded damascene;

a second dielectric layer over said dielectric capping layer, said second dielectric layer having a dielectric constant less than about 3.5; and, a second partially embedded damascene in said dielectric capping layer and said second dielectric layer wherein said second partially embedded damascene having a larger width than said first partially embedded damascene at least partially upon said first partially embedded damascene to form a dual damascene.

13. The integrated circuit device of claim 12, wherein the predetermined height is greater than about $X(1-1/e)$ wherein X is a thickness of said first portion of said first barrier layer, and the constant e is base of the natural logarithm.

14. The integrated circuit device of claim 12, wherein said first barrier layer comprises a material selected from the group consisting of a refractory metal and a refractory metal nitride.

15. The integrated circuit device of claim 12, wherein said first barrier layer comprises cobalt, tungsten or combinations thereof.

16. The integrated circuit device of claim 12, wherein said second barrier layer comprises a conductive alloy comprising a material selected from the group consisting of Si, Ge, and combinations thereof, said conductive alloy further comprising said conductive material.

17. The integrated circuit device of claim 12, wherein said second barrier layer comprises a conductive alloy comprising a material selected from the group consisting of cobalt, tungsten, and combinations thereof.

18. The integrated circuit device of claim 12, wherein said second barrier layer comprises a conductive alloy comprising said conductive material.

19. The integrated circuit device of claim 12, wherein the dielectric layer comprises carbon doped silicon oxide.

20. An integrated circuit device with improved adhesion to an overlying dielectric layer comprising:

a conductive material partially embedded in an opening formed in a dielectric layer;

a first barrier layer partially embedded in said opening formed in said dielectric layer, wherein said first barrier layer comprises first portions covering sidewall portions of said conductive material; and a second barrier layer upon only a top portion of said conductive material;

wherein said conductive material and said first portions of said first barrier layer extend to a predetermined height above an upper surface of said dielectric layer to form a partially embedded damascene, said predetermined height not less than about 0.63 time the thickness of said first portion of said first barrier layer;

wherein said second barrier layer comprises a conductive alloy comprising said conductive material, said conductive alloy having an average grain size substantially the same or greater than an average grain size of said first portion of said first barrier layer.

* * * * *